(12) United States Patent
Park et al.

(10) Patent No.: US 7,384,844 B2
(45) Date of Patent: Jun. 10, 2008

(54) METHOD OF FABRICATING FLASH MEMORY DEVICE

(75) Inventors: Jeong Hwan Park, Kyeongki-do (KR); Tae Gyun Kim, Seoul (KR); Dong Kee Lee, Kyeongki-do (KR)

(73) Assignee: Hynix Semiconductor Inc., Icheon-si (KR)

( * ) Notice: Subject to any disclaimer, the term of this patent is extended or adjusted under 35 U.S.C. 154(b) by 245 days.

(21) Appl. No.: 11/297,147

(22) Filed: Dec. 7, 2005

(65) Prior Publication Data

US 2006/0223264 A1 Oct. 5, 2006

(30) Foreign Application Priority Data

Mar. 22, 2005 (KR) .................. 10-2005-0023471

(51) Int. Cl.
*H01L 21/336* (2006.01)
(52) U.S. Cl. .................. 438/257; 438/211; 438/306
(58) Field of Classification Search ................ 438/613, 438/612, 614, 521, 211, 257, 258, 262, 299, 438/301, 306, 307
See application file for complete search history.

(56) References Cited

U.S. PATENT DOCUMENTS

| 5,789,292 | A | 8/1998 | Yamazaki et al. |
| 6,025,229 | A | 2/2000 | Hong |
| 6,235,589 | B1 | 5/2001 | Meguro |
| 6,605,506 | B2 | 8/2003 | Wu |
| 6,777,758 | B2 * | 8/2004 | Yamashita et al. .......... 257/369 |
| 6,803,277 | B1 | 10/2004 | Dong et al. |
| 2002/0041000 | A1 * | 4/2002 | Watanabe et al. ........... 257/369 |
| 2004/0029372 | A1 * | 2/2004 | Jang et al. .................. 438/586 |

FOREIGN PATENT DOCUMENTS

| KR | 10-2001-0061414 A | 7/2001 |
| KR | 10-2003-0038041 A | 5/2003 |
| KR | 10-2004-0008520 A | 1/2004 |
| KR | 10-2004-0062276 A | 7/2007 |

\* cited by examiner

*Primary Examiner*—Kevin M Picardat
(74) *Attorney, Agent, or Firm*—Townsend and Townsend and Crew LLP

(57) ABSTRACT

A method of fabricating a flash memory device includes defining a high voltage region and a low voltage region on a substrate. The high voltage region provides an area for one or more first transistors configured to operation at a first voltage, the low voltage region providing an area for one or more second transistors configured to operation at a second voltage that is lower than the first voltage, each first transistor having a gate and a source/drain region on each side of the gate. A first impurity region is formed as part of the source/drain region, the first impurity region having a first depth from an upper surface of the substrate, the first impurity region being of first conductivity having a first impurity concentration. A second impurity is formed as part of the source/drain region, the second impurity region having a second depth from the upper surface of the substrate that is less than first depth, the second impurity region being of the first conductivity and having a second impurity concentration that is greater than the first impurity concentration. Impurities of second conductivity are implanted into the source/drain region.

14 Claims, 5 Drawing Sheets

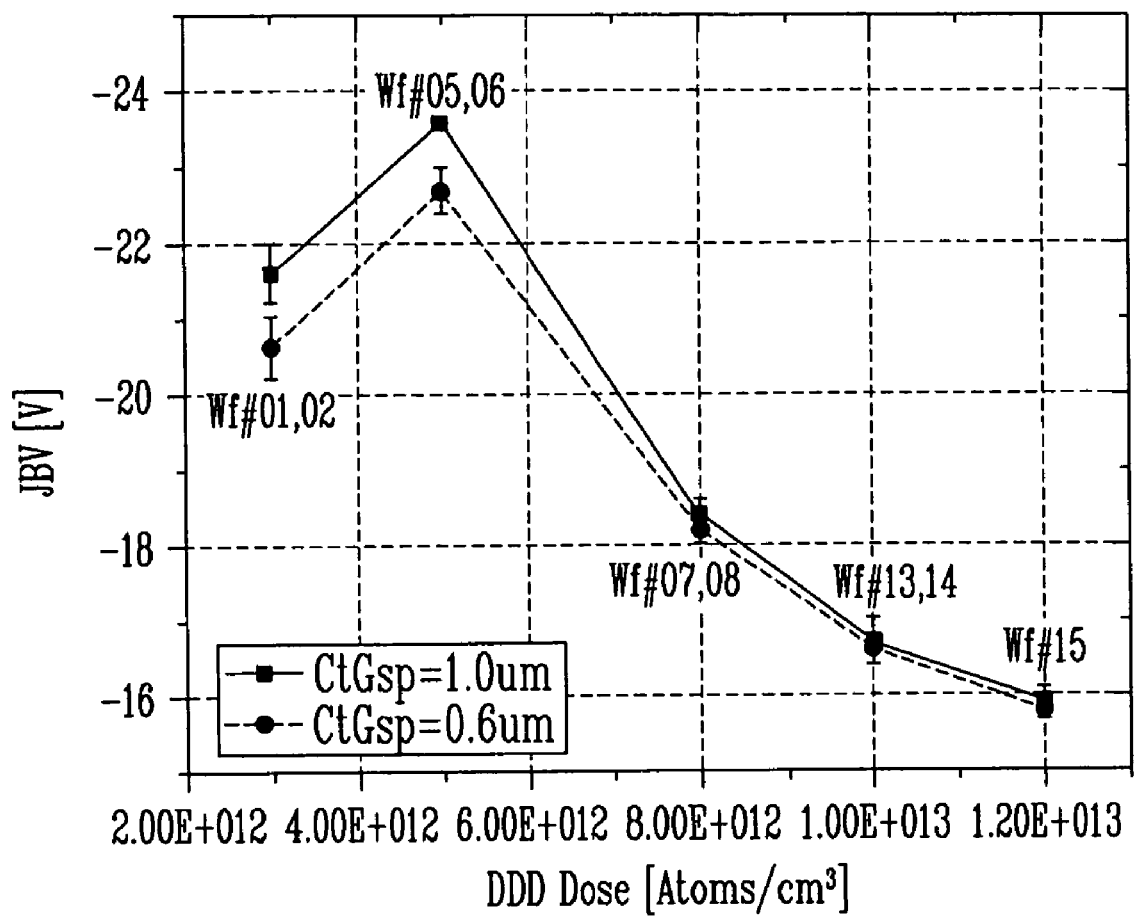

METHOD OF FABRICATING FLASH MEMORY DEVICE

BACKGROUND OF THE INVENTION

The present invention relates to a flash memory device, and more specifically to a method of fabricating a flash memory device, in which the junction breakdown voltage (JBV) and the on-current margin of a high-voltage PMOS transistor can be improved.

In a NAND flash memory device, a high-voltage bias is used upon program/erase. In order to supply the high-voltage bias to a cell, a high-voltage transistor must be located at the end of the wordline and the bitline, so that a high-voltage can be smoothly applied.

In a single-level cell (hereinafter referred to as "SLC") in which 1 bit is stored per cell, programming is performed in steps of 500 mV, from 16V to 19.5V. In a multi-level cell (hereinafter, referred to as "MLC") in which two or more bits are stored per cell, however, cell distribution must be smaller than that of the SLC. Accordingly, a problem is presented by the narrowness of the process margin.

In order to solve this problem, a high-voltage PMOS transistor is used in the MLC in order to improve the cell threshold voltage distribution.

FIGS. 1a-1d are sectional views for illustrating a method of fabricating a flash memory device in the related art. The same reference numerals will be used to identify like or similar parts having the same function.

In order to fabricate the conventional flash memory device, an N-well is formed in a high-voltage PMOS transistor region of a P-type conductive semiconductor substrate. The semiconductor has two regions, a high-voltage PMOS transistor region and a low-voltage element region (or cell region). The semiconductor substrate 10 is divided into an active region and a field region by an isolation process.

Referring next to FIG. 1a, a tunnel oxide film 11a, a polysilicon film 11b for a floating gate, an interlayer dielectric film 11c, and a polysilicon film 11d for a control gate are laminated on the semiconductor substrate 10. The polysilicon film 11d for a control gate, the interlayer dielectric film 11c, and the polysilicon film 11b for a floating gate are selectively etched by photolithography, so that gates 11 are formed on the high-voltage PMOS transistor region and the low-voltage element region.

Thereafter, in order to mitigate damage to the gates 11 caused by the etch process, a re-oxide film 12 is formed on the lateral sides and the top surface of the gates 11 by a re-oxidation process.

As shown in FIG. 1b, a first photoresist layer PR1 is coated on the entire surface and is patterned by an exposure and development process, so that the high-voltage PMOS transistor region is exposed.

P− ions are then implanted using the patterned first photoresist layer PR1 as a mask, thus forming low-concentration P-type ion implant regions 13 in the N-well on both sides of the gate 11 of the high-voltage PMOS transistor region.

The low-concentration P-type ion implant region 13 functions to mitigate a JBV reduction phenomenon, which is generated due to a difference in the concentration between the N-well and a high-concentration P-type ion implant region to be formed later. At this time, the region 13 is formed at a low-concentration doping level.

Thereafter, as shown in FIG. 1c, P+ ions are implanted using the first photoresist layer PR1 as a mask, thus forming high-concentration P-type ion implant regions 14 in the low-concentration P-type ion implant region 13.

A source and drain junction of a Double Doped Drain (DDD) structure having the high-concentration P-type ion implant regions 14 surrounded by the low-concentration P-type ion implant regions 13 is completed thereby.

After the first photoresist layer PR1 is removed, a deep UV photoresist is coated on the entire surface as a second photoresist layer PR2. The second photoresist layer PR2 is then patterned to expose the low-voltage element region, as shown in FIG. 1d.

An N-type ions, such as P31 and As75 ions, having a concentration of 1E13 ions/cm$^3$ or less, is then implanted using the patterned second photoresist layer PR2 as a mask, thus forming low-concentration N-type ion implant regions 15 in the semiconductor substrate 10 on both sides of the gate 11 of the low-voltage element region.

Thereafter, though not shown in the drawing, the second photoresist layer PR2 is removed and a spacer is formed on both sides of the gate 11 of the high-voltage PMOS transistor region and the low-voltage element region. N+ ions are implanted into the semiconductor substrate 10 on both sides of the gate 11 and the spacer of the low-voltage element region, thus forming a high-concentration N-type ion implant region.

In order for a high-concentration PMOS transistor to maintain a high junction breakdown (JBV), the concentration of the low-concentration P-type ion implant region 13 needs to be low. However, if the concentration of the P-type ion implant region 13 is low, there are less charge carriers available for current and results in reducing the on-current of the high-voltage PMOS transistor.

BRIEF SUMMARY OF THE INVENTION

One advantage of the present invention is a method of fabricating a flash memory device, in which the current derivability can be improved without lowering the JBV.

According to an embodiment of the present invention, a method of fabricating a flash memory device is provided, including the steps of forming a plurality of gates on a semiconductor substrate having a high voltage PMOS transistor region and a low-voltage element region, forming low-concentration P-type ion implant regions in the semiconductor substrate on both sides of the gate of the high-voltage PMOS transistor region, implanting BF2 ions of a high concentration into the high-voltage PMOS transistor regions to form high-concentration P-type ion implant regions within the low-concentration P-type ion implant regions, and implanting a N-type impurity ion of low concentration into the high-voltage PMOS transistor region and the low-voltage element region.

According to a second embodiment of the present invention, a method of fabricating a flash memory device is provided, including the steps of forming a plurality of gates on a semiconductor substrate having a high voltage PMOS transistor region and a low-voltage element region, forming low-concentration P-type ion implant regions in the semiconductor substrate on both sides of the gate of the high-voltage PMOS transistor region, implanting N-type impurity ions of low concentration into the high-voltage PMOS transistor region and the low-voltage element region, and forming high-concentration P-type ion implant regions within the low-concentration P-type ion implant regions by implanting high-concentration BF2 ions into the high-voltage PMOS transistor regions.

In one embodiment, a method of fabricating a flash memory device includes defining a high voltage region and a low voltage region on a substrate. The high voltage region provides an area for one or more first transistors configured to operation at a first voltage, the low voltage region providing an area for one or more second transistors configured to operation at a second voltage that is lower than the first voltage, each first transistor having a gate and a source/drain region on each side of the gate. A first impurity region is formed as part of the source/drain region, the first impurity region having a first depth from an upper surface of the substrate, the first impurity region being of first conductivity having a first impurity concentration. A second impurity is formed as part of the source/drain region, the second impurity region having a second depth from the upper surface of the substrate that is less than first depth, the second impurity region being of the first conductivity and having a second impurity concentration that is greater than the first impurity concentration. Impurities of second conductivity are implanted into the source/drain region. The source/drain region reference to a conductive region provided at each end of the gate, where the conductive region is configured to be either a source or drain region.

The first transistor is a PMOS transistor and the first conductivity is P-type conductivity, and the second conductivity is N-type conductivity. The impurities of the second type are implanted into the source/drain region using a first energy level, so that a significant amount of the impurities of the second type are implanted below the second impurity region. The second impurity region is formed by implanting impurities of the first type with a first energy level, and the impurities of the second type are implanted into the source/drain region with a second energy level, the second energy level being higher than the first energy level. The forming-a-second -impurity-region includes implanting $BF_2$ ions into the source/drain region while masking the low voltage region. Fluorine (F) components of the $BF_2$ ions prevents boron (B) components from diffusing out of the source/drain region and into the substrate.

In another embodiment, a method of fabricating a flash memory device includes defining a high voltage region for P-type transistors and a low voltage regions for N-type transistors on a substrate; forming a first P-type region on each side of a gate of at least one of the P-type transistor; implanting an N-type impurity ions into the first P-type region; and forming a second P-type regions within the first P-type regions using $BF_2$ ions, the second P-type region being of a higher concentration level than that of the first P-type region. The N-type impurities are implanted into the first P-type region at a dose that is less than a dose used to form the second P-type region. The N-type impurities are implanted to a depth that is below that of the second P-type region.

BRIEF DESCRIPTION OF THE DRAWINGS

FIG. 3 is a graph showing JBV vs. the concentration of the low concentration P-type ion implant region.

DETAILED DESCRIPTION OF THE INVENTION

Figure 1A:
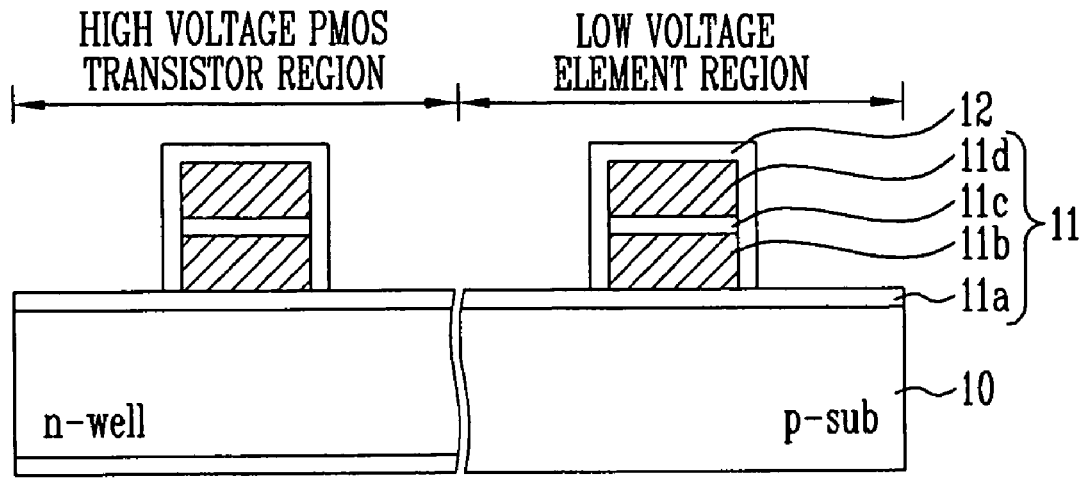
FIGS. 1a-1d are sectional views illustrating a method of fabricating a flash memory device in the related art.
Figure 1B:
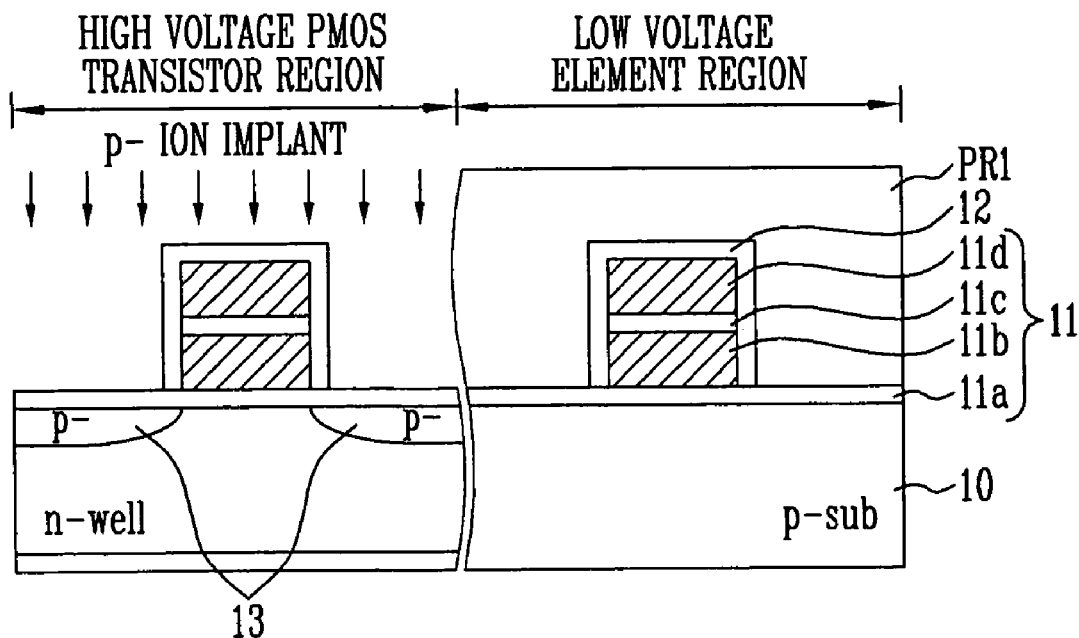
Figure 1C:
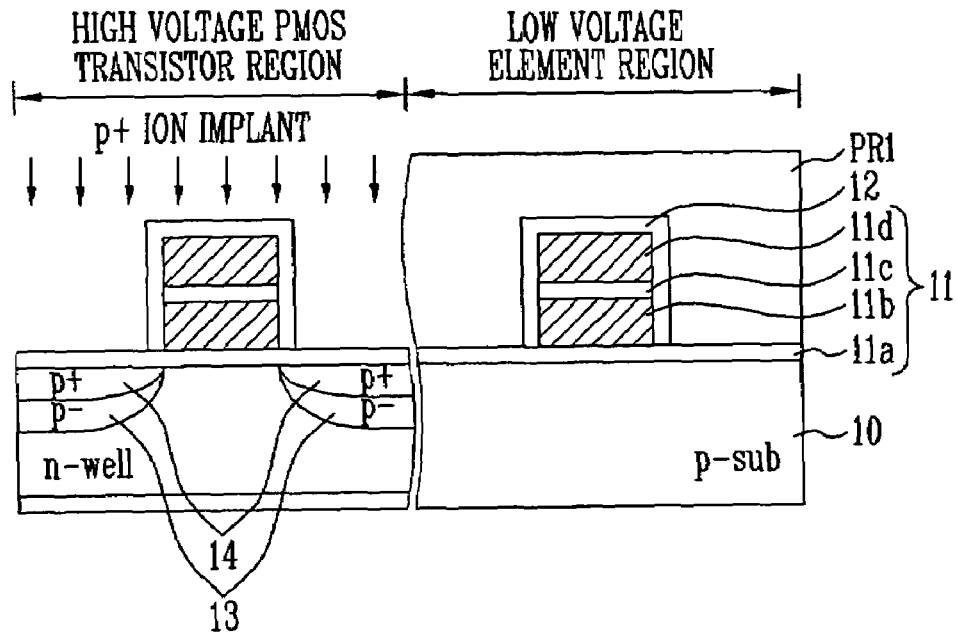
Figure 1D:
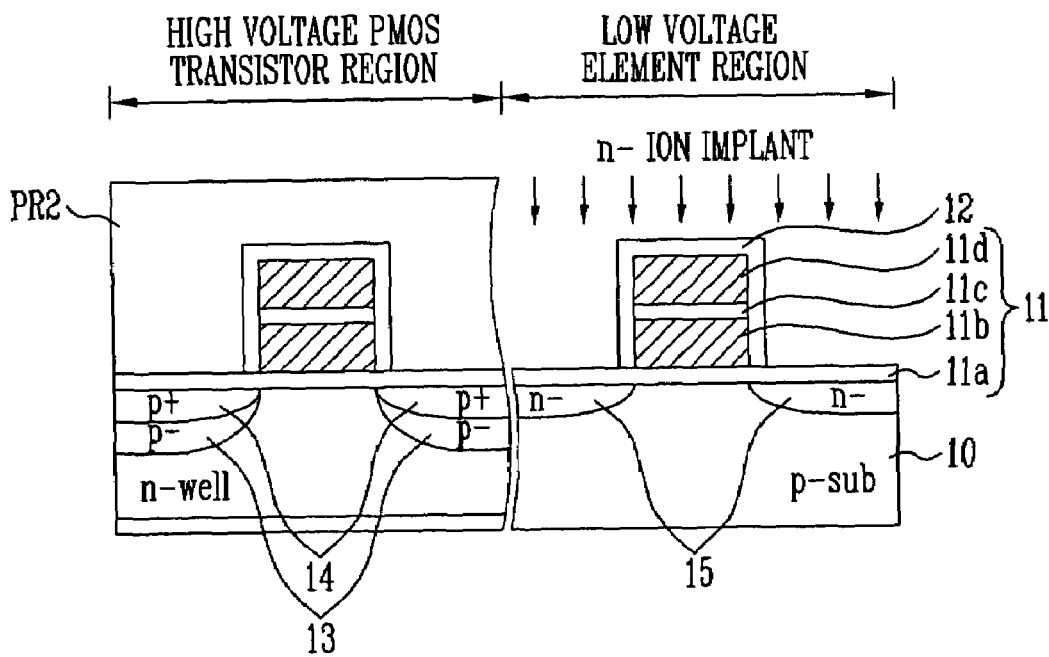

Preferred embodiments of the present invention will now be described with reference to the accompanying drawings.

FIGS. 2a-2d are sectional views illustrating a method of fabricating a flash memory device according to an embodiment of the present invention. The same reference numerals will be used to identify like or similar parts having the same function.

Figure 2A:
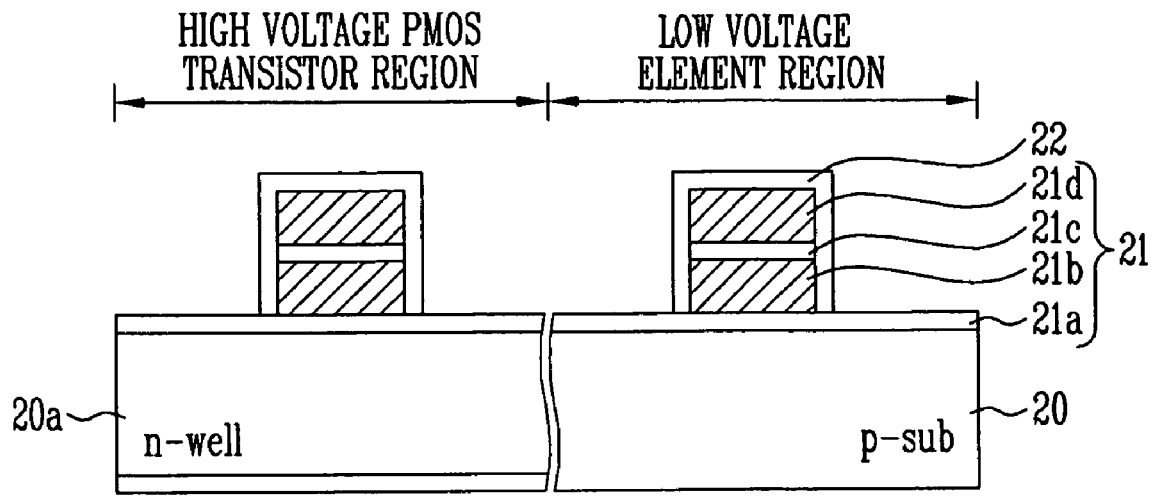
FIGS. 2a-2d are sectional views illustrating a method of fabricating a flash memory device according to an embodiment of the present invention.

As shown in FIG. 2a, an N-well 20a is formed in a high-voltage PMOS transistor region of a P-type conductive semiconductor substrate 20 having a high voltage PMOS transistor region and a low-voltage element region. The semiconductor substrate 20 is divided into an active region and a field region through an isolation process.

A tunnel oxide film 21a, a polysilicon film 21b for a floating gate, an interlayer dielectric film 21c, and a polysilicon film 21d for a control gate are then laminated on the semiconductor substrate 20. The polysilicon film 21d for the control gate, the interlayer dielectric film 21c, and the polysilicon film 21b for the floating gate are selectively etched using a photo and etch process, thus forming gates 21 on the high-voltage PMOS transistor region and the low-voltage element region.

In order to mitigate damage to the gates 21 caused by the etch process, a re-oxide film 22 is formed on the top surface and lateral sides of the gates 21 by a re-oxidation process.

Figure 2B:
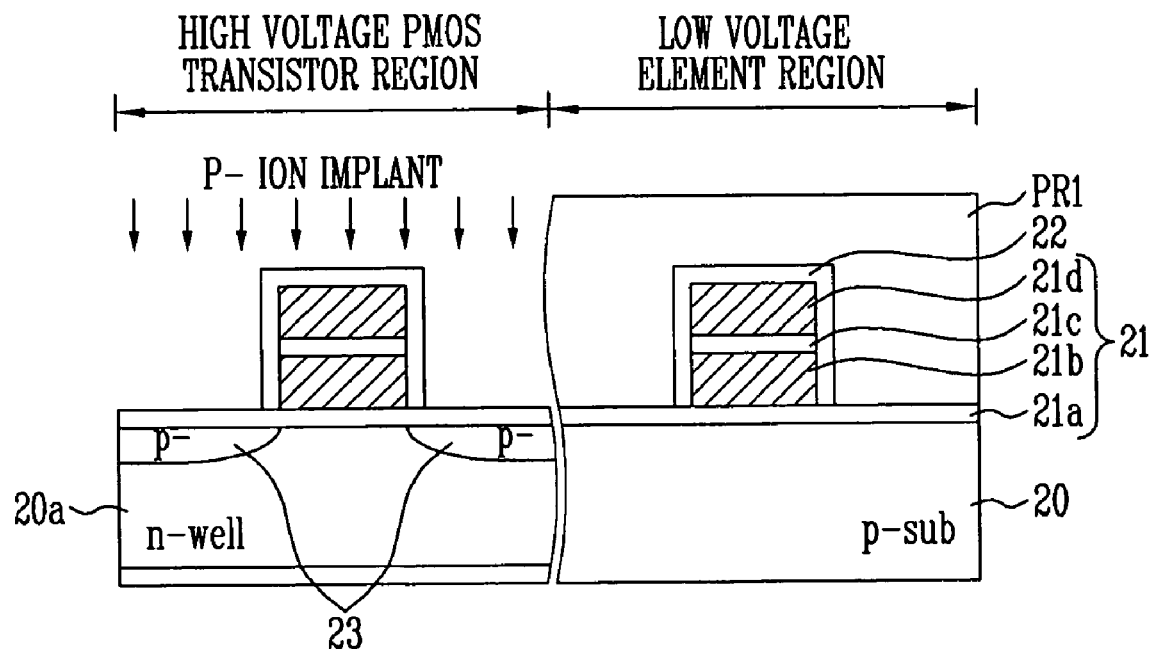

A first photoresist layer PR1 is then coated on the entire surface. The first photoresist layer PR1 is patterned by an exposure and development process so that the high-voltage PMOS transistor region is exposed, as shown in FIG. 2b.

Thereafter, a P− ion such as B11 ion having a concentration of $2.0E12$-$8.0E12$ions/cm$^3$ is implanted using the patterned first photoresist layer PR1 as a mask, thus forming the low-concentration P-type ion implant regions 23 in the N-well 20a on both sides of the gates 21 of the high-voltage PMOS transistor region. The first photoresist layer PR1 is then removed.

When the B11 ion is implanted, ion implant energy is 25 to 50 KeV with a tilt angle of 0°. In order to strengthen overlapping between the gate 21 and the source and drain junction, however, the tilt angle is 3°-7°. The tilt angle defines the angle of incidence of the ions being implanted into the surface of the substrate. Zero degree tilt means that the angle of the incidence of the ions is substantially orthogonal to the surface of the substrate.

FIG. 3 is a graph showing variations in JBV depending on the concentration of the low-concentration P-type ion implant region when the distance (CtCsp) between the gate and an ohmic contact is 1.0 μm, and 0.6 μm. From FIG. 3, it can be seen that in order to maintain the JBV at 22V or higher, the concentration of the low-concentration P-type ion implant region 23 should be kept between $4.0E12$-$6.0E12$ ions/cm$^3$, outside which the JBV abruptly falls over the concentration range. In one implementation the low-concentration P-type ion implant region 23 has concentration of $2E12$-$8E12$ ions/cm$^3$.

In the operation of a MOSFET, an on-current generally needs to be raised in order to increase the design margin, and the doping concentration of the source and drain junction needs to be increased in order to increase the on-current. If the concentration of the source and drain junction increases, however, a problem is introduced by the fact that the on-current is increased, but the JBV is reduced.

Figure 2C:
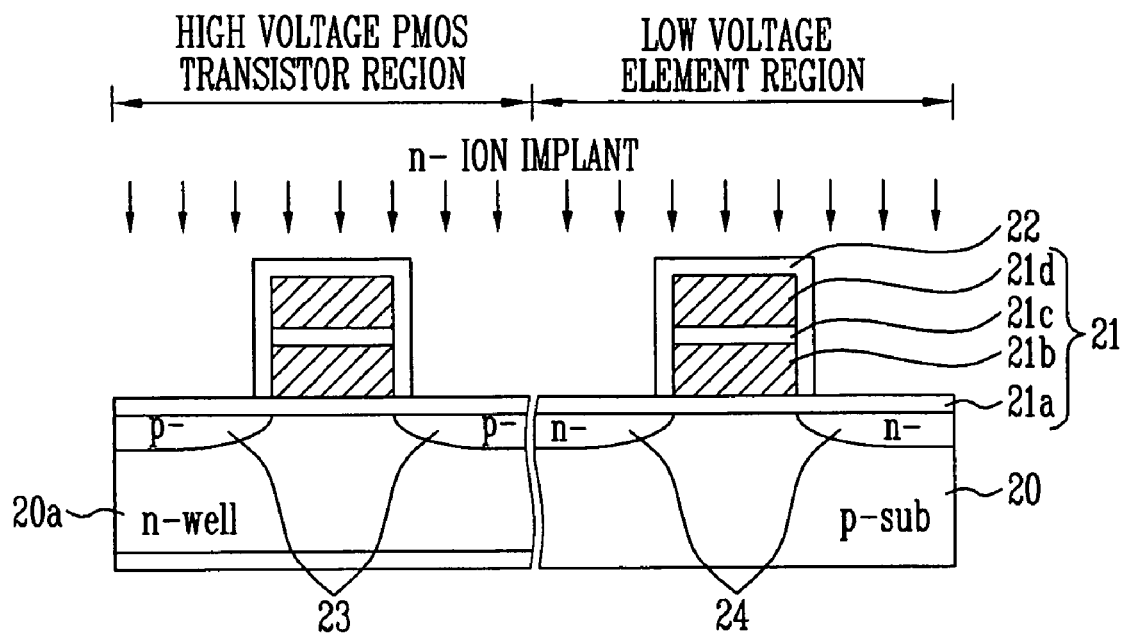

In order to solve this problem, as shown in FIG. 2c, the N− ion implant process of forming the low-concentration N-type ion implant region 24 of the low-voltage element region is also performed in the high-voltage PMOS transistor region.

In other words, low-concentration N-type ion implant regions 24 are formed in the semiconductor substrate 20 on both sides of the gates 21 of the low-voltage element region by implanting a N– ion such as phosphor (P) and arsenic (As) with a low concentration into the low-voltage element region and the high-voltage PMOS transistor region.

Meanwhile, an effect in which a greater amount of boron (B) ion can be relatively implanted in a current pass period occurs in the high-voltage PMOS transistor region due to the implanted N-type ions. Accordingly, there is an effect in that the on-current can be enhanced.

Figure 2D:
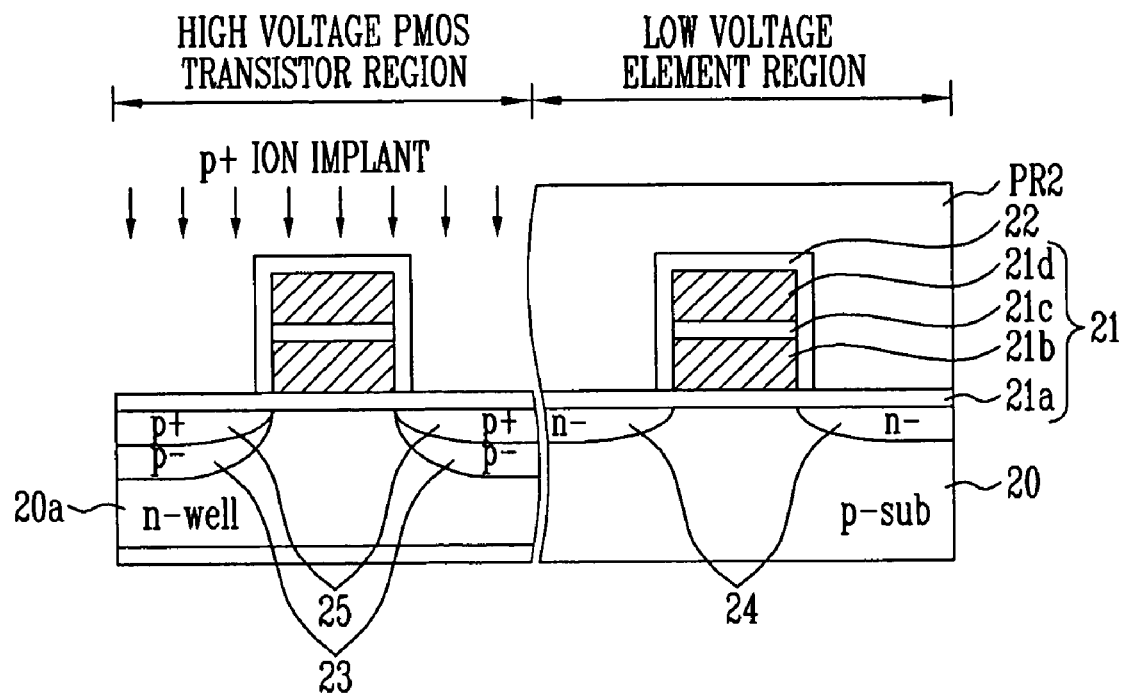

A second photoresist layer PR2 is then coated on the entire surface. The second photoresist layer PR2 is patterned by an exposure and development process so that the high-voltage PMOS transistor region is exposed, as shown in FIG. 2d.

Thereafter, a BF2 ion with a high concentration is implanted using the patterned second photoresist layer PR2 as a mask, thus forming high-concentration P-type ion implant regions 25 within the low-concentration P-type ion implant regions.

If B11 is used when the ion is implanted, the boron (B) ion is excessively diffused below the semiconductor substrate 20 due to a subsequent thermal treatment process. It thus becomes difficult to obtain a satisfactory JBV. Accordingly, the diffusion of boron (B) below the semiconductor substrate 20 is prohibited by fluorine (F) ions being out-diffused on the surface by implanting BF2 ions of high concentration, so that a high-concentration junction having a shallow depth can be formed. Consequently, the source and drain regions of the PMOS in the high voltage regions has relatively high concentration at its upper portion (region 25) and a relatively low concentration at its lower portion (region 23). In one implementation, the dopant concentration in the source and drain regions gradually decreases from the upper portion of the region to the lower portion of the region. It is thus possible to minimize the difference in the concentration between the high-concentration P-type ion implant region 25 and the N well 20a, and thus to obtain a satisfactory JBV.

Though not shown in the drawing, the second photoresist layer PR2 is removed. A spacer is formed on both sides of the gates 21 of the high-voltage PMOS transistor region and the low-voltage element region. High-concentration N-type ion implant regions are then formed in the semiconductor substrate 20 on both sides of the gates 21 and the spacer of the low-voltage element region, thus forming a source and drain junction of a DDD structure.

It has been described above that the process of implanting the BF2 ions of high concentration (FIG. 2d) is performed after the process of implanting the N– ions (FIG. 2c). It is, however, to be understood that the process of implanting the BF2 ions of high concentration (FIG. 2d) can be performed before the process of implanting the N– ions (FIG. 2c).

In this case, the first photoresist layer PR1 used upon implantation of the P– ion can also be used in the process of implanting the BF2 ions of high concentration. This can avoid the formation of the second photoresist layer PR2 and can simplify the process.

As described above, the present invention has the following advantages:

First, a deep UV mask may not be necessary when N– ions are implanted into a low-concentration element region. Accordingly, the production cost depending on the use of an expensive deep UV mask can be avoided.

Second, Turn Around Time (TAT) can be shortened since the deep UV mask process can be omitted.

Third, a greater amount of boron (B) ion can be implanted in the current pass period of the high-voltage PMOS transistor by implanting N– ions into the high-voltage PMOS transistor region. This results in improved on-current margin. Furthermore, since BF2 ions are used as P+ ions implanted into the high-voltage PMOS transistor, the phenomenon in which the B ions are diffused into the bottom can be prevented. It is thus possible to minimize the difference in the concentration between a high-concentration P-type ion implant region and an N-well and thus obtain a satisfactory JBV.

Although the above description has been made with reference to the preferred embodiments, it is to be understood that changes and modifications of the present invention may be made by one of ordinary skill in the art without departing from the scope of the present invention and appended claims.

What is claimed is:

1. A method of fabricating a flash memory device, the method comprising:

defining a high voltage region and a low voltage region on a substrate, the high voltage region providing an area for one or more first transistors configured to operation at a first voltage, the low voltage region providing an area for one or more second transistors configured to operation at a second voltage that is lower than the first voltage, each first transistor having a gate and a source/drain region on each side of the gate;

forming a first impurity region as part of the source/drain region, the first impurity region having a first depth from an upper surface of the substrate, the first impurity region being of first conductivity having a first impurity concentration;

forming a second impurity region as part of the source/drain region, the second impurity region having a second depth from the upper surface of the substrate that is less than first depth, the second impurity region being of the first conductivity and having a second impurity concentration that is greater than the first impurity concentration; and implanting impurities of second conductivity into the source/drain region, wherein the second conductivity is contrary to the first conductivity.

2. The method of claim 1, wherein the first transistor is a PMOS transistor and the first conductivity is P-type conductivity, and the second conductivity is N-type conductivity.

3. The method of claim 1, wherein the impurities of the second type are implanted into the source/drain region using a first energy level, so that a significant amount of the impurities of the second type are implanted below the second impurity region.

4. The method of claim 1, wherein the second impurity region is formed by implanting impurities of the first type with a first energy level, and the impurities of the second type are implanted into the source/drain region with a second energy level, the second energy level being higher than the first energy level.

5. The method of claim 1, wherein the impurities of the second conductivity are implanted into the source/drain region after forming the first impurity region.

6. The method of claim 1, wherein the impurities of the second conductivity are implanted into the source/drain region before forming the first impurity region.

7. The method as claimed in claim 1, wherein the forming-a-second-impurity-region includes implanting $BF_2$ ions into the source/drain region while masking the low voltage region.

8. The method as claimed in claim 7, wherein the first impurity region is formed using $B_{11}$ ions having a concentration of 2E12 to 8E12 ions/cm$^3$.

9. The method as claimed in claim 8, wherein the first impurity region is formed by implanting B11 ions using an energy level of 25 to 50 KeV.

10. The method as claimed in claim 7, wherein fluorine (F) components of the $BF_2$ ions prevents boron (B) components from diffusing out of the source/drain region and into the substrate.

11. The method as claimed in claim 7, wherein the first impurity region is formed using $B_{11}$ ions having a concentration of 4E12 to 6E12 ions/cm$^3$.

12. A method of fabricating a flash memory device, the method comprising:

defining a high voltage region for P-type transistors and a low voltage regions for N-type transistors on a substrate;

forming a first P-type region on each side of a gate of at least one of the P-type transistors such that a source/drain region is formed for the at least one of the P-type transistors;

implanting an N-type impurity ions into the first P-type region; and forming a second P-type region within the first P-type region using $BF_2$ ions, the second P-type region being of a higher concentration level than that of the first P-type region.

13. The method as claimed in claim 12, wherein the N-type impurities are implanted into the first P-type region at a dose that is less than a dose used to form the second P-type region.

14. The method as claimed in claim 13, wherein the N-type impurities are implanted to a depth that is below that of the second P-type region.

* * * * *